United States Patent
Singh et al.

(10) Patent No.: US 8,369,134 B2
(45) Date of Patent: Feb. 5, 2013

(54) TFET BASED 6T SRAM CELL

(75) Inventors: Jawar Singh, University Park, PA (US);
Ramakrishnan Krishnan, Hsinchu (TW); Saurabh Mookerjea, Hillsboro, OR (US); Suman Datta, Port Matilda, PA (US); Vijaykrishnan Narayanan, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 184 days.

(21) Appl. No.: 12/912,904

(22) Filed: Oct. 27, 2010

(65) Prior Publication Data
US 2012/0106236 A1 May 3, 2012

(51) Int. Cl.
*G11C 11/00* (2006.01)
(52) U.S. Cl. ... 365/154; 365/104; 365/226; 365/189.04; 365/189.09; 365/191
(58) Field of Classification Search .................. 365/154, 365/104, 226, 189.04, 189.09, 191
See application file for complete search history.

(56) References Cited

U.S. PATENT DOCUMENTS

| | | | |
|---|---|---|---|
| 7,136,296 | B2 | 11/2006 | Luk et al. |
| 2007/0236982 | A1* | 10/2007 | Chuang et al. ................ 365/154 |
| 2007/0267619 | A1 | 11/2007 | Nirschl |

OTHER PUBLICATIONS

Kim, D. et al. (2009) "Low Power Circuit Design Based on Heterojunction Tunneling Transistors (HETTs)", ISLPED '09: pp. 1-6.

* cited by examiner

*Primary Examiner* — Thong Q Le
(74) *Attorney, Agent, or Firm* — Novak Druce Connolly Bove + Quigg LLP

(57) ABSTRACT

Memory devices and methods of operation are provided. A memory device includes first and second cross-coupled inverters and first and second access transistors coupled to an input node of the second inverter. The memory device also includes a control circuit for providing a first reference voltage at a first ground node of the first inverter and a second reference voltage at a second ground node of the second inverter. The first access transistor is configured to conduct current from a first bit line to the input node and to provide substantially no current conduction from the input node to the first bit line. The second access transistor is configured to conduct current from the input node to one of the first bit line and a second bit line and to provide substantially no current conduction from the input node to the one of first and second bit lines.

20 Claims, 13 Drawing Sheets

1100

| Gate Length, $L_G$ | 30 nm |
| Oxide thickness, $T_{OX}$ | 2.5 nm |
| Gate di-electric constant, $\xi$ | 21 ($HfO_2$) |
| Body thickness, $T_{Si}$ | 7 nm |
| Gate overlap | 2 nm |
| Source/Drain Doping, $N_{S/D}$ | $10^{20}$ cm$^{-3}$ |
| Channel Doping, $N_{Ch}$ | $10^{15}$ cm$^{-3}$ |

TFET BASED 6T SRAM CELL

STATEMENT REGARDING FEDERALLY FUNDED RESEARCH

This invention was made with government support Grant No. 0829926, awarded by the National Science Foundation. The Government has certain rights in the invention.

FIELD OF THE INVENTION

The present invention relates memory devices and more particularly to static random access memory devices.

BACKGROUND

Continued miniaturization of silicon CMOS transistor technology has resulted in an unprecedented increase in single-core and multi-core performance of modern-day microprocessors. However, the exponentially rising transistor count has also increased the overall power consumption making performance per Watt of energy consumption, the key figure-of-merit for today's high-performance microprocessors. Today, energy efficiency serves as the central tenet of high performance microprocessor technology at the system architecture level as well as the transistor level ushering in the era of energy efficient nanoelectronics. Aggressive supply voltage scaling while maintaining transistor performance is a direct approach towards reducing the energy consumption since it reduces the dynamic power quadratically and the leakage power linearly. In MOSFETs, the OFF-state leakage current (IOFF) increases exponentially with reduction of threshold voltage. There are various leakage current mechanisms, such as band to band tunneling (BTBT) at the drain-channel junction, the gate tunneling leakage current through the ultra-thin gate dielectric and even direct tunneling from source to drain increases with continued scaling. Hence there is a fundamental limit to the scaling of the MOSFET threshold voltage and hence the supply voltage. Scaling supply voltage limits the ON current (ION) and the ION-IOFF ratio. This theoretical limit to threshold voltage scaling mainly arises from MOSFETs 60 mV/decade sub-threshold swing at room temperature and it significantly restricts low voltage operation.

Leakage power consumption in SRAMs has been a major concern in caches since the International Technology Roadmap for Semiconductors (ITRS) projected that the percentage of memory in System on Chip designs (SoCs) will increase from the current 84% to as high as 94% by the year 2014. As indicated above, low voltage operation is one of the most effective low power design techniques due to its quadratic dynamic and linear static energy savings. However, in current MOSFET-based designs, lower threshold voltages increase the sub-threshold current exponentially and ultra thin gate oxides cause a huge increase in gate current. Various methods such as multiple threshold voltages and increased gate oxide thicknesses have been explored to reduce leakage current in SRAMs. Adaptive or dynamic body biasing techniques have also been explored for this purpose.

Recently, leakage reduction using steep sub-threshold transistors has gained great attention. A steep sub-threshold transistor allows us to operate at very low threshold voltages with ultra low leakage currents and low supply voltages ($V_{DD}$). TFETs, which work on the principle of inter-band tunneling, have shown to be a promising steep sub-threshold transistor. However integration of TFETs into CMOS transistor technology is generally difficult, as the unidirectionality of TFET devices generally limits their applicability to memory devices or requires more complex memory cell architectures.

SUMMARY

The embodiments of the invention concern memory devices and methods of operating memory device. In a first embodiment of the invention, a memory device is provided. The device includes first and second cross-coupled inverters and first and second access transistors coupled to an input node of the second inverter. The device also includes at least one control circuit for selectively providing a first reference voltage at a first ground node of the first inverter and a second reference voltage at a second ground node of the second inverter. In the device, the first access transistor is configured to conduct current from a first bit line to the input node and to be substantially incapable of conducting current from the input node to the first bit line. Further, the second access transistor is configured to conduct current from the input node to one of the first bit line and a second bit line and to be substantially incapable of conducting current from the one of the first and the second bit lines to the input node. In some configurations, the first and second access transistors can be TFET devices. In other configurations, the transistors in the cross-coupled inverters can also be TFET devices.

In a second embodiment of the invention, a method of reading a bit value stored in a latch cell having first and second cross-coupled inverters and first and second access transistors coupled to an input node of the second inverter is provided. In the latch cell, the first access transistor is configured to conduct current from a first bit line to the input node and to be substantially incapable of conducting current from the input node to the first bit line and the second access transistor is configured to conduct current from the input node to one of the first bit line and a second bit line and to be substantially incapable of conducting current from the one of the first and second bit lines to the input node. The method includes the steps of setting at least the first bit line to a desired voltage and opening at least the first access transistor. The method also includes the steps of measuring a current or voltage in the first bit line in response to the opening the first access transistor and determining the stored value based on the monitored current or voltage.

In a third embodiment of the invention, a method of writing a bit value into a latch cell having first and second cross-coupled inverters and first and second access transistors coupled to the input node of the second inverter is provided. In the method, the first access transistor is configured to conduct current from a first bit line to the input node and to be substantially incapable of conducting current from the input node to the first bit line. Further, the second access transistor is configured to conduct current from the input node to a second bit line and to be substantially incapable of conducting current from the second bit line to the input node. The method includes the steps of increasing a difference between a first reference voltage at a first ground node of the first inverter and a second reference voltage at a second ground node of the second inverter. The method further includes setting at least one of the first and second bit lines to a desired bit value and opening at least one of the first and second access transistors based on the desired bit value. The method also includes reducing a difference between the first reference voltage and the second reference voltage and closing the open ones of the first and second access transistors, responsive to the step of opening.

In the method, the step of increasing can include selecting the first reference voltage to be higher than the second reference voltage. Further, the step of opening can include opening at least the first access transistor if the desired bit value is a high bit value, else opening at least the second access transistor. Additionally, the step of reducing can include selecting the first reference voltage to be substantially equal to the second reference voltage.

DETAILED DESCRIPTION

Figure 1:
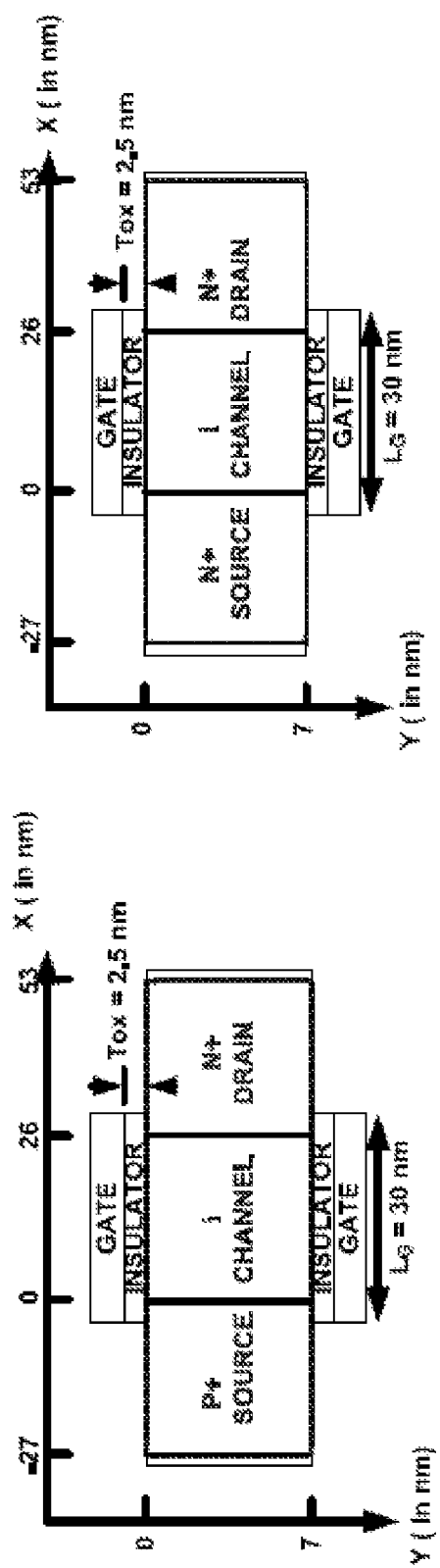
FIG. 1 shows structural models of double gate N-channel and P-channel Si-TFETs.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

I. Tunnel Field Effect Transistors (TFETs)

As described above, the inter-band Tunnel Field Effect Transistor (TFET) is of great interest due to its potential for sub-KT/q sub-threshold slope device operation which enables supply voltage reduction for low power logic applications. FIG. 1 shows an optimized double gate device structure of a silicon based N-channel (N-type) and P-channel (P-type) TFET. A conventional N-type TFET consists of a p+ source, intrinsic (i) channel and a n+ drain and a conventional P-type TFET has n+ source, intrinsic channel and p+ drain regions. In general, the source and drain regions are heavily doped regions with the channel region being intrinsic. Further, the gate work function of an N-channel TFET is typically modified suitably to obtain a P-channel TFET.

Figures 2, 3:
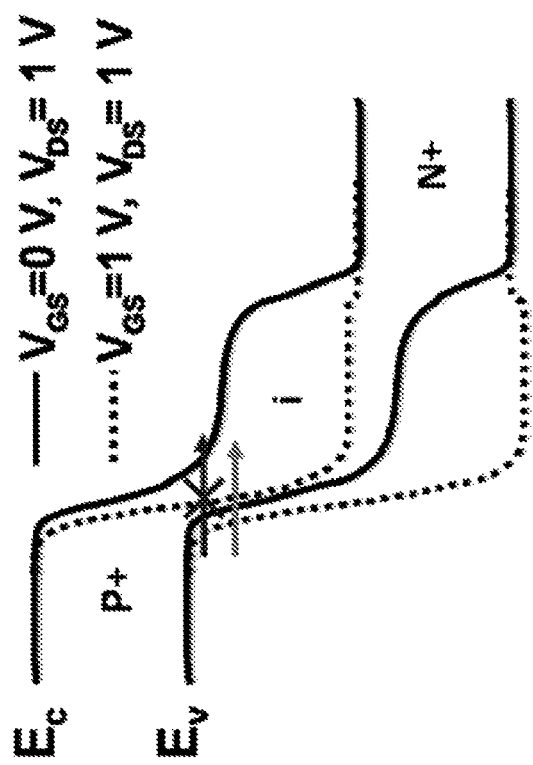
FIG. 2 is a band diagram of a Si-NTFET under ON and OFF conditions.
FIG. 3 is a table of nominal Si-TFET parameter values.

FIG. 2 shows the band-diagram of a conventional N-type TFET during the ON and OFF state. In the OFF state ($V_{GS}$=0V, $V_{DS}$=1V), in general, the conduction ability of the MOSFET is limited by the source side p-n junction barrier which prevents the thermionic emission of carriers. In the ON state ($V_{GS}$=1V, $V_{DS}$=1V), the source barrier is negligible which enables over the barrier thermionic emission. In contrast, TFETs operate by tunneling of carriers from the valence band in the source to the conduction band in the channel. In the OFF state ($V_{GS}$=0V, $V_{DS}$=1V), the transmission probability is typically low due to the thick depletion region associated with the source to channel tunnel junction resulting in very low OFF currents. With the application of the gate voltage ($V_{GS}$=1V, $V_{DS}$=1V), the depletion region shrinks and the carriers tunnel through the barrier. Since the TFET ON current is generally limited by the inter-band quantum mechanical tunneling (as opposed to thermionic emission over the barrier) the ON current in silicon TFETs is typically much lower than MOSFETs. The reverse biased leakage current under in the OFF state ($V_{GS}$=0V, $V_{DS}$=1V) yields extremely low OFF current in the order of pico-Amperes to femto-Amperes.

Figure 5:
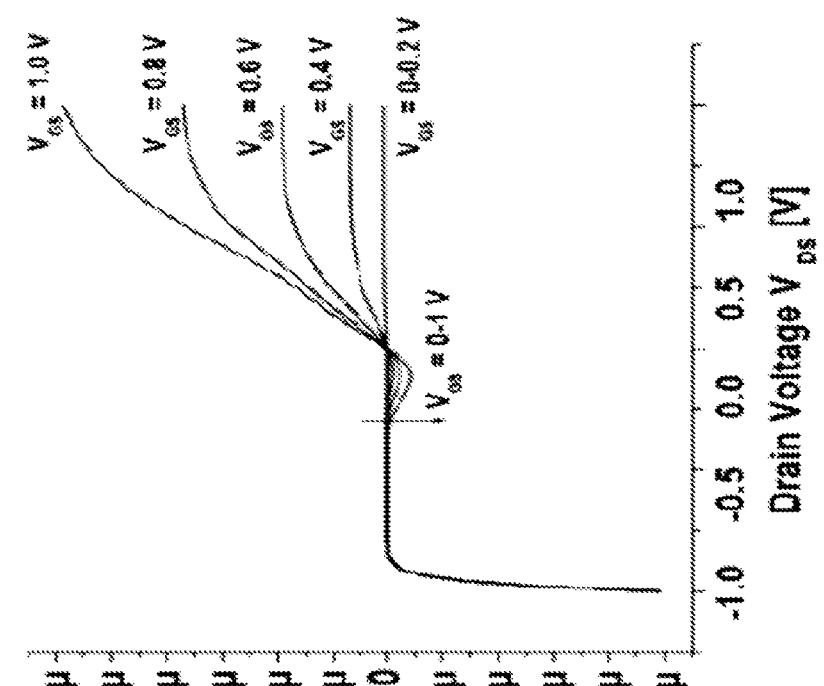
FIG. 5 shows several TCAD simulated ID-VD characteristics of a Si-NTFET.
Figure 4:
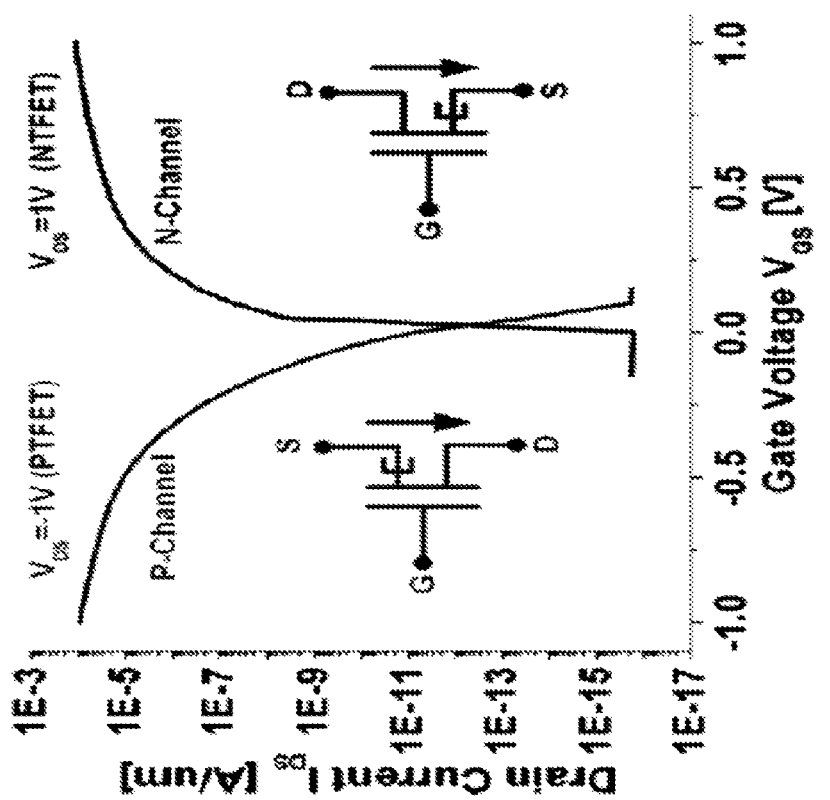
FIG. 4 shows the ID-VG characteristics of a Si TFETs.

The table in FIG. 3 shows an exemplary set of parameters for TFET devices for SRAM cells in the various embodiments of the invention. FIG. 4 shows the ID-VG characteristics of such Si NTFET and PTFET device at $V_{DS}$=1V. As shown in FIG. 4, an $I_{DSAT}$=120 µA/µm of is obtained for both the NTFET and PTFET devices. In the various embodiments, the reverse bias leakage can be set to the order of pico-femto amperes by modifying the gate work function. The gate leakage can be negligible if high-k dielectrics are used. FIG. 5 shows the ID-VD characteristics of the Si NTFET for different values of $V_{GS}$. As shown in FIG. 5, the NTFET device exhibits expected characteristics due to tunneling during positive $V_{DS}$ (reverse bias conditions) while $I_{DS}$ increases significantly for two conditions when $V_{DS}$ is negative (forward bias). When $V_{DS}$ is ~−1V, there is a significant $I_{DS}$ irrespective of the value of $V_{GS}$. Significant current conduction is also observed when $V_{DS}$ is slightly negative and $V_{GS}$ is positive. This is due to electrons tunneling from the conduction band of intrinsic 'i' region to the valence band of p+ source region.

II. TFET Based SRAM Design Challenges

Figure 6A:
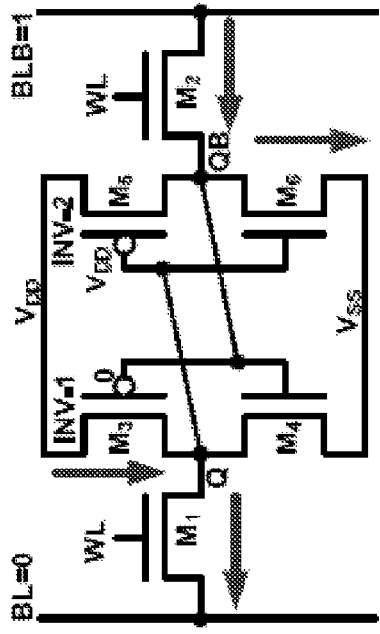
FIGS. 6(a) and 6(b) show conventional 6T CMOS SRAM bit-cell current flow paths during read and write operations respectively.

As mentioned above, the unidirectional (asymmetric) current conducting TFETs limit the viability of conventional 6T SRAM bit-cells. In order to illustrate the implications of asymmetric behavior TFETs in SRAM bit-cells, it is useful to first understand conventional 6T CMOS SRAM bit-cell current flow paths during read and write operations. FIG. 9 shows a conventional 6T CMOS SRAM bit-cell storing a high bit value or '1'. To read the stored bit value, both the bit-lines BL and BLB are typically pre-charged to $V_{DD}$ and then disconnected from the supply voltage. Then, the word-line (WL) is activated to high, turning on access transistors M1 and M2. The read current path, as shown in FIG. 6(a), typically consists of transistor M2 and M6 and pulls down the bit-line BLB since node QB stores '0'. On the other hand, bit-line BL remains at '1' since node Q stores '1'. The difference between these bit-lines is sensed by a sense amplifier (not shown in FIG. 9) to determine the stored value. Note that using a unidirectional transistor (such as a TFET) in place of the MOSFET does not adversely affect the read operation. This is because only one current path exists, which is in the inward direction (i.e., from one of the bit-lines towards a ground or reference node (Vss) through M4 or M6 depending on whether Q and QB store '1' or '0'). The read-stability (and speed) is determined by the sizing ratio of these transistors (M6 to M2 or M5 to M3), which is commonly referred as a cell ratio (β).

Figure 6B:
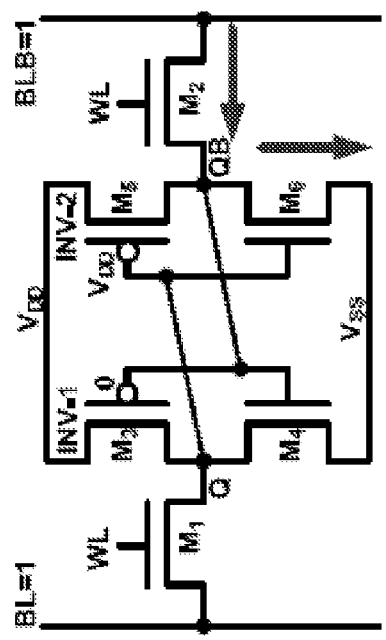

Similarly for writing a low bit value or '0', the current paths are shown in FIG. 6(b). From initially pre-charged bit-lines BL and BLB, followed by the word-line (WL) activation to high, the bit-line BL is driven to the ground or reference voltage by a write driver while BLB is held at '1'. This drives node Q to ground through pass-gate transistor M1 while, at the same time, access transistor M2 pulls up the node QB to a certain extent thus making the SRAM bit-cell flip more easily. It should be noted that for writing operation two current paths exist, one is in the inward direction (i.e. M2 to M6) for pulling up the node QB, while another is in the outward direction (i.e. M3 to M1) for pulling down the node Q.

Replacing the bi-directional MOSFETs with unidirectional TFETs in the 6T CMOS SRAM bit-cell does not place any restrictions on read stability. However, the writing operation may be significantly impaired by the implementation of unidirectional transistors as one of the flow paths may disappear. For example, when writing a '0', the current path M1 to BL will disappear, assuming that the TFET substituted for the MOSFET M1 is configured to conduct from the bit-line BL towards node Q, that is connecting the TFET in an 'inward' configuration. Similarly, when writing a '0' when the TFET replacing MOSFET M2 is connected in an 'outward' configuration (i.e., conducting from node QB towards bit-line BLB), the current path from bit-line BLB to node QB disappears.

A. 6T TFET SRAM Bit-Cell with Inward Access Transistors

Figure 7A:
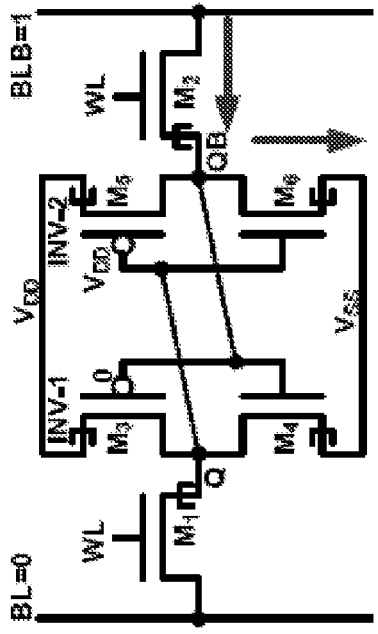
FIGS. 7(a) and 7(b) show the 6T TFET SRAM bit-cell current flow paths for the inward access transistor configuration during read and write operations respectively.
Figure 7B:
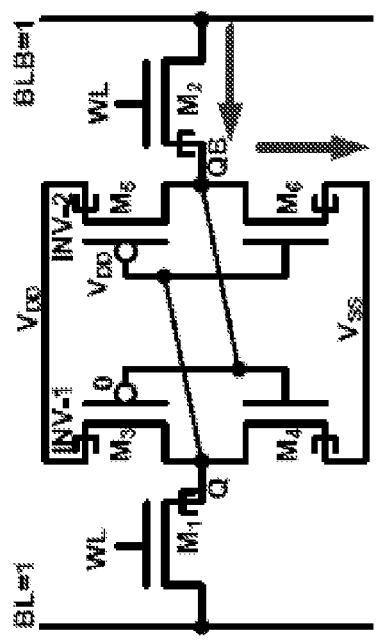
Figures 8, 10:
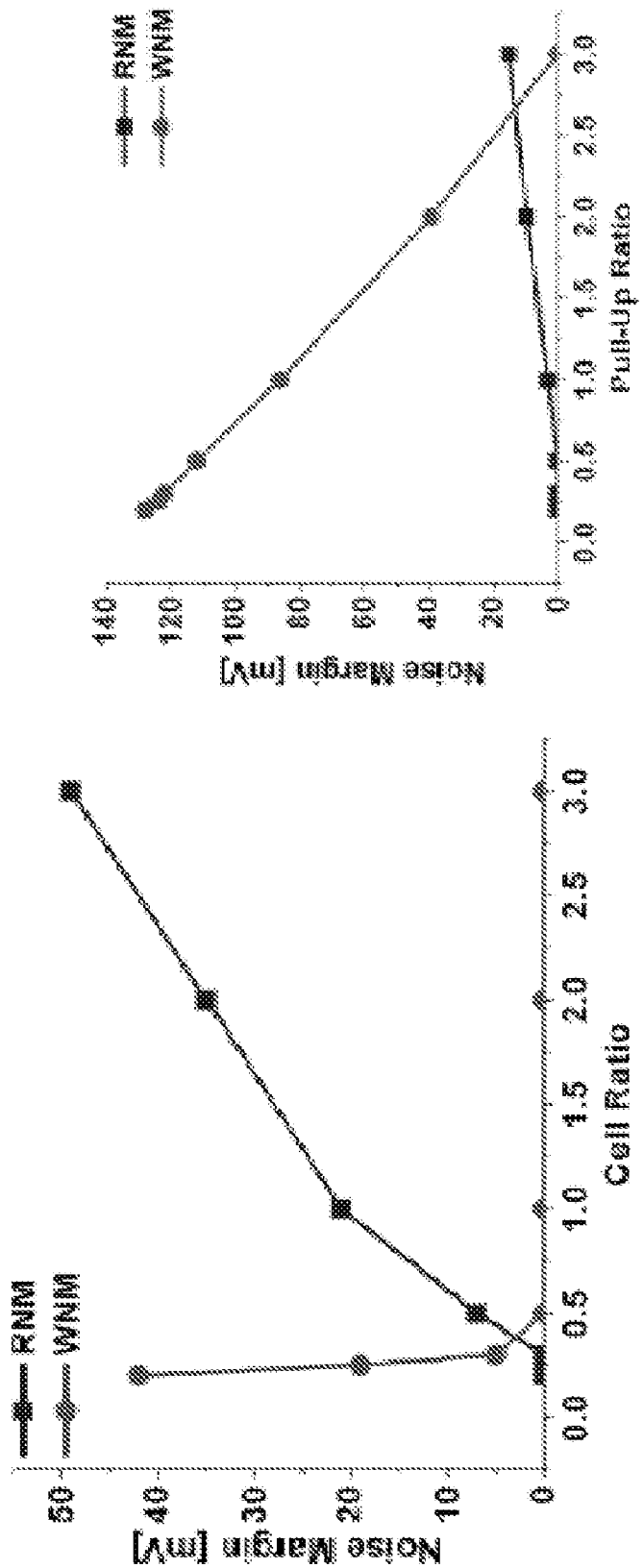
FIG. 8 shows noise margins for 6T TFET SRAM with inward access transistors configuration at $V_{DD}$=0.5V.
FIG. 10 illustrates the noise margins for an 6T TFET SRAM with the outward access transistor configuration at $V_{DD}$=0.5V.

FIGS. 7(a) and 7(b) show the 6T TFET SRAM bit-cell topology with inward access transistors (M1, M2) storing a bit value '1'. To read a stored value from this bit-cell topology, both bit-lines would pre-charged to $V_{DD}$ and bit-line BLB is pulled down through the current path formed by M2 and M6, as shown in FIG. 7(a). The bit-line, BL, remains at '1', and the difference of these bit-lines is sensed by the sense amplifier to determine the stored value. However, to write '0' to this bit-cell topology, access transistor M1 cannot pull down the node Q since it conducts only in inward direction. Therefore, access transistor M2 must pull up the node QB without any assistance from the access transistor, M1, to well above the trip-point voltage of the inverter (INV-1), as shown in FIG. 7(b). As a result, a write operation performed by the single access transistor may substantially worsen the write-ability or, in other words, significantly reduce the Write Noise Margin (WNM) compared to that of a 6T CMOS bit-cell. Therefore, to achieve good write-ability, access transistors (M1 and M2) must be stronger than the pull down transistors (M4 and M6). As used herein with respect to comparing the performance of transistors, the term "stronger transistor" refers to a transistor having a higher conductance and a higher drive current. In the case of MOSFET devices, this is typically provided by increasing channel width. Thus, a smaller cell ratio (CR) would be provided. FIG. 8 shows the read and write noise margins (RNM and WNM) for 6T TFET SRAM bit-cell with inward access transistors configuration at $V_{DD}$=0.5V. It can be seen from FIG. 8 that the WNM (Curve 802) reduces to 0 for cell ratios ($\beta=W_{Pull-Down}/W_{Access}$)>0.3 while RNM (Curve 804) is 0 for β<0.3. Therefore, a 6T TFET SRAM bit-cell with inward access transistors may have enough read margin but a poor WNM makes this configuration impractical.

B. 6T TFET SRAM Bit-Cell with Outward Access Transistors

Figure 9A:
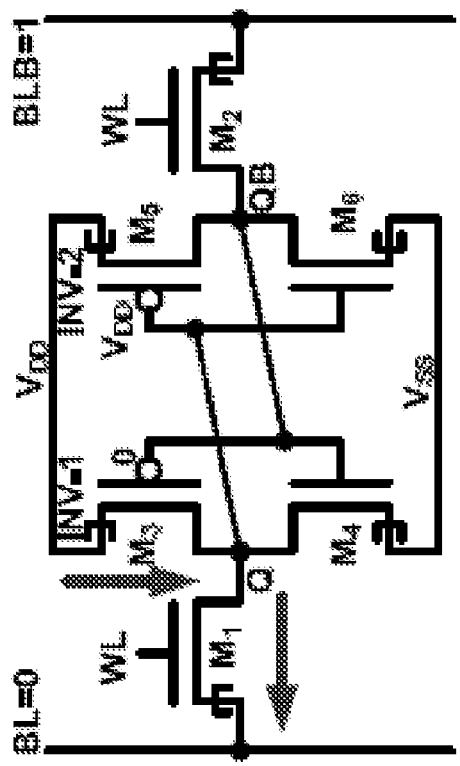
FIGS. 9(a) and 9(b) illustrate 6T TFET SRAM bit-cell current flow path for the outward access transistor configuration during read and write operations, respectively.
Figure 9B:
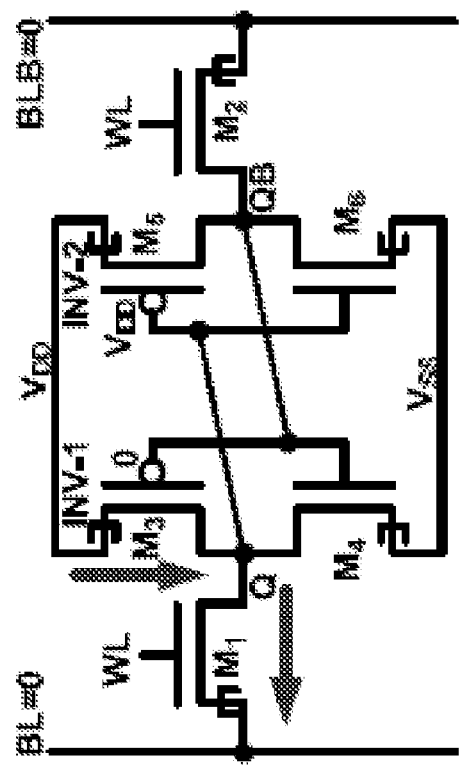

FIGS. 9(a) and 9(b) show the 6T TFET SRAM bit-cell configuration with outward access transistors (M1, M2) storing a bit value '1' during read and write operations, respectively. To read a stored value, from this bit-cell topology, both the bit-lines are initially discharged to '0'. With the activation of word-line (WL), access transistor (M1) starts conducting in outward direction and pulls up the bit-line (BL) through the current flow path formed by M3 and M1, as shown by the arrows in FIG. 9(a). The bit-line BLB remains at '0', and the difference of these bit-lines is sensed by a sense amplifier (not shown in FIG. 9(a)) to determine the stored value. In this configuration, Read Noise Margin (RNM) is governed by the pull-up ratio (WPull-Up/WAccess). Therefore, pull-up transistors (M3 and M5) must be stronger than the access transistors (M1 and M2), in order to prevent the read failure. Otherwise access transistor (M1) may easily drain out the node Q to ground or reference voltage.

However, to write into this bit-cell topology, both the bit-lines are initially pre-charged to $V_{DD}$ and during the write cycle one of the bit-line has to be driven to ground or reference voltage by the write driver. In order to write '0' to this bit-cell configuration, BL is driven to ground or reference voltage, while BLB is remains at '1'. However, access transistor M2 cannot conduct in inward direction to pull down the BLB. Therefore, the write operation is again performed by one access transistor (M1) only, and not differentially aided by the other access transistor M2.

In this configuration, the Write Noise Margin (WNM) is governed by the pull-up ratio ($W_{Pull-Up}/W_{Access}$). For a successful write operation, access transistors (M1 and M2) must be stronger than the pull-up transistors (M3 and M5). As a result, both read and write operations have conflicting sizing requirements. This can be seen in FIG. 10. FIG. 10 illustrates the noise margins for a 6T TFET SRAM with the outward access transistor configuration at $V_{DD}$=0.5V. As shown in FIG. 10, the RNM (Curve 1002) starts to increase only for pull-up ratios ($W_{Pull-Up}/W_{Access}$) greater than 1.5 while WNM (Curve 1004) reduces rapidly with increases in the pull-up ratio.

Thus, a 6T TFET SRAM bit-cell with either inward or outward access transistor configuration cannot be designed with acceptable stability margins. Both the inward and outward access transistor configurations have conflicting device sizing requirements, which is further worsened by un-aided read or write operation.

C. 7T TFET SRAM Bit-Cell

To overcome the challenges of TFET unidirectionality in 6T TFET SRAMS, 7 Transistor (7T) SRAM designs have been proposed. In particle, such designs include an extra read bit-line and separate word-line to achieve higher stability margins (see D. Kim, Y. Lee, J. Cai, I. Lauer, L. Chang, S. J. Koester, D. Sylvester, and D. Blaauw, *"Low power circuit design based on heterojunction tunneling transistors (hetts),"* in ISLPED '09: Proceedings of the 14$^{th}$ ACM/IEEE international symposium on Low power electronics and design, New 25 York, N.Y., USA: ACM, 2009, pp. 219-224.). However, as this design requires a 7$^{th}$ transistor, an extra read bit-line, and a separate word-line, it is significantly more complicated than existing 6 transistor designs. Further, the additional transistor results in an increased footprint.

III. Novel 6T TFET SRAM Bit-Cell

As shown in the previous section, current 6T TFET SRAM bit-cell designs are not feasible, due to poor RNM and WNM constraints posed by the conflicting devices sizing requirement. In view of the limitations of these 6T SRAM TFET designs and other conventional SRAM TFET designs, the various embodiments of the invention provide a new 6T TFET SRAM bit-cell. This disclosed design provides an SRAM bit-cell with a minimum number of devices and preserves adequate RNM and WNM. Such a bit-cell is shown in FIG. 11.

A. Bit-Cell Configuration

Figure 11:
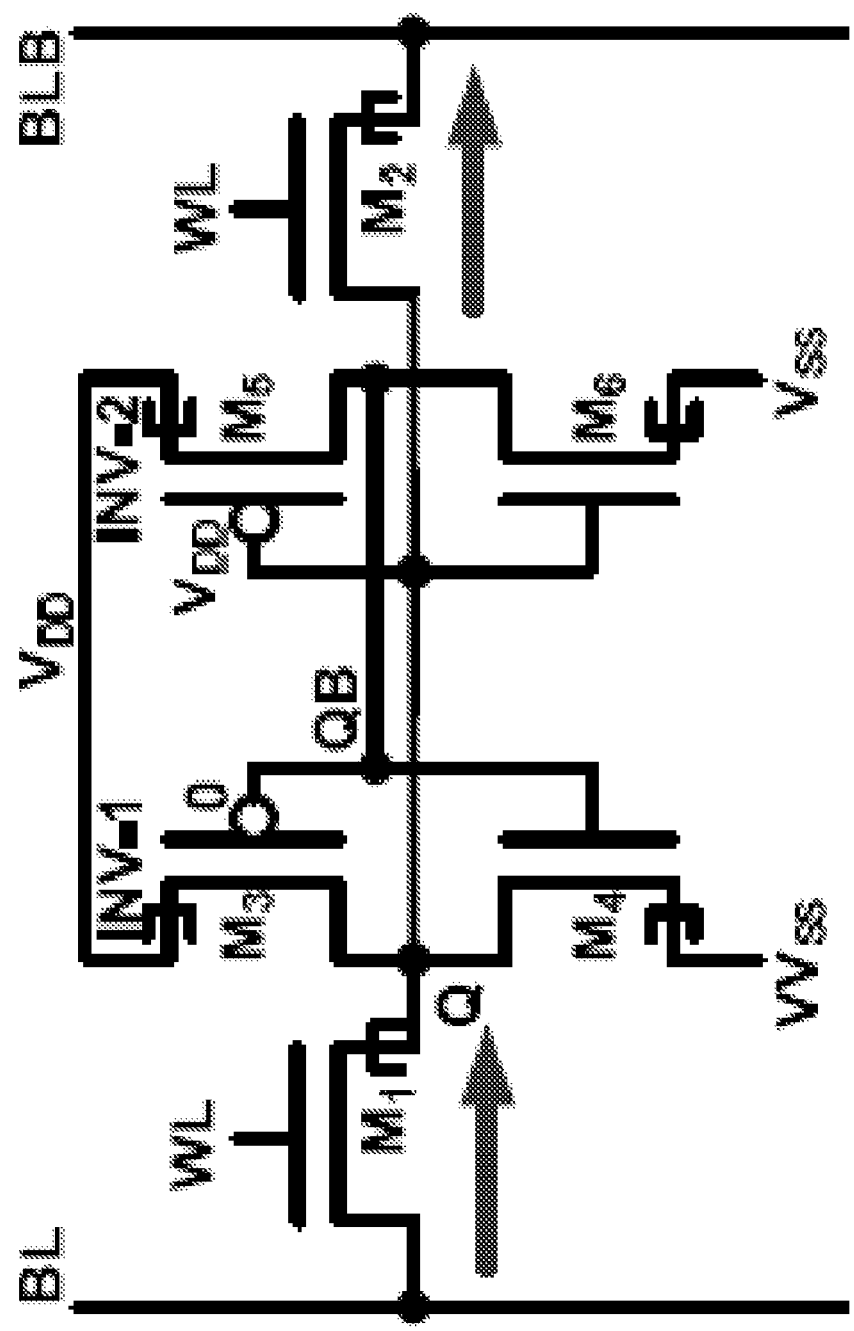
FIG. 11 shows a 6T TFET SRAM bit-cell design for low power applications according to an embodiment of the invention.

FIG. 11 is a schematic diagram of a 6T TFET SRAM bit-cell 1100 in accordance with the various embodiments of the invention. The bit-cell 1100 includes of a pair of cross-coupled inverters, INV-1 and INV-2 and a pair of access transistors M1, M2. The first inverter INV-1 is arranged in a conventional converter configuration with a pull-up transistor M3 and a pull-down transistor M4 coupled to a high voltage supply node $V_{DD}$ and a first reference supply node $VV_{SS}$, respectively. The second inverter INV-2 also includes a conventional inverter arrangement of a pull-up transistor M5 and a pull-down transistor M6 coupled to the high voltage supply node $V_{DD}$ and a second reference supply node $V_{SS}$, respectively. In bit-cell 1100, the output node of the first inverter INV-1 (i.e., common source/drain nodes of M3 and M4) is coupled to the input node of the second inverter INV-2 to define a first storage node Q of the bit-cell 1100. Further, the input node of the first inverter INV-1 (i.e., the gate nodes of M3 and M4) is coupled to the output node of the second inverter INV-2 (i.e., common source/drain nodes of M5 and M6) to define a second, complementary storage node QB of bit-cell 1100.

As shown in FIG. 11, the first access transistor M1 couples the first storage node Q to a first bit line BL and the second access transistor M2 couples the first storage node Q to a second bit line BLB, where first bit line BL and the second hit line BLB are complementary. The first and second access transistors M1, M2 can be controlled by a control signal on at write line node WL in the bit-cell 1100.

Figure 12:
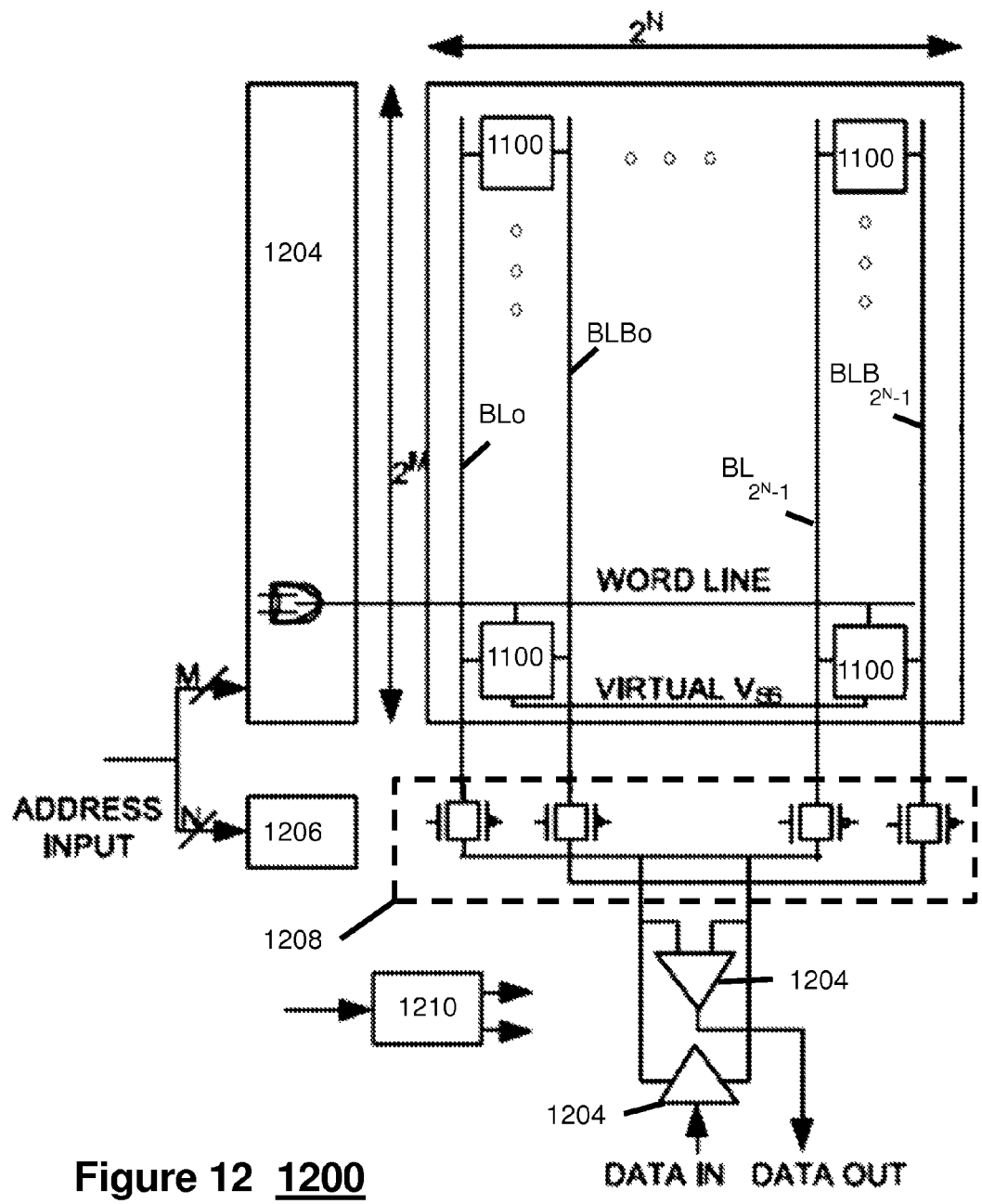
FIG. 12 shows a schematic of a memory region in an integrated circuit comprising an array of 6T TFET SRAM bit-cells according to the design of FIG. 11 along with associated array control circuitry.

The bit-cell 1100 can be included in a memory array. For example, FIG. 12 is a block diagram of a memory portion 1200 in an integrated circuit in accordance with the various embodiments of the invention. The memory portion 1200 consists of a $2^M \times 2^N$ array 1202 of bit-cells 1600, where the $V_{DD}$ and Vss nodes of each of the bit-cells 1600 is coupled to a supply voltage and a reference voltage, respectively (not shown). As in a conventional memory array, memory 1200 includes a row decoder 1204 for generating signals for word lines WLm (m=0 ... $2^M$-1) and a column decoder 1206 for generating signals for reading and writing to bit lines BLn and BLBn (n=0 ... $2^N$-1) via column multiplexer 1208. The decoders 1204 and 1206 are configured to receive an address from a controller 1210 to select the bit-cells to be accessed. The controller 1208 can receive signals from elsewhere in the IC. The controller 1210 can also be configured to selectively operate a write driver 1212 and a sense amplifier 1214 to write and read signals to the bit lines in the array. The controller 1210 can further be configured to directly or indirectly generate and/or control voltage for the VVss nodes of each of the bit-cells 1100. That is, the controlled can include a voltage supply circuit for providing an adjustable voltage for the VVss nodes of the bit-cells 1100 or can provide control signals to a voltage supply circuit (not shown) that provides voltages for the VVss nodes of the bit-cells 1100.

In the various embodiments of the invention, the first and second access transistors M1, M2 are configured to be unidirectional. In particular, as shown in FIG. 11, the first access transistor M1 is configured to allow current to flow from bit line BL to first storage node Q when transistor M1 is on and to prevent little or no current to flow from storage node Q to bit line BL when access transistor M1 is on or off Further, the second access transistor M2 is configured to allow current to flow from first storage node Q to second bit line BLB when transistor M2 is on and to prevent little or no current to flow from second bit line BLB to storage node Q when access transistor M2 is on or off. Thus, in some embodiments of the invention, a TFET is used for access transistors M1 and M2, wherein transistor M1 is in an inward access configuration and transistor M2 is in an outward access configuration. However, the various embodiments of the invention are not limited to solely the use of TFETs for access transistors M1 and M2. Rather, any type of unidirectional transistor configuration. For example, in some embodiments, unidirectional quantum field effect transistors or the like can be used.

In the configuration illustrated in FIG. 11, the transistors in the first and second inverters INV-1 and INV-2 are shown as conventional CMOS transistors. However, the various embodiments of the invention are not limited in this regard. For example, in one configuration, TFETs or other unidirectional transistors, similar to those used for transistors M1 and M2 can also be used for the transistors in the first and second inverters INV-1 and INV-2. Such a configuration reduces manufacturing complexity as the same transistor manufacturing flow can be used to form all portions of bit-cell 1100. Additionally, such a configuration allows logic circuits in the integrated circuit to be concurrently formed. In other configurations, any other suitable transistor may be employed, such as a heterojunction tunneling transistor (hett).

In the various embodiments, first reference supply node VVss is not coupled to the same voltage supply providing a reference voltage at second reference supply node Vss, as described above. Such a configuration enables the voltage at VVss to be controlled independently of the voltage at Vss. As a result, the gain of the first inverter INV-1 can be controlled independently of the gain of the second inverter INV-2. Thus, the feedback effect of the first inverter INV-1 for the second inverter INV-2 can be strengthened or weakened by reducing or increasing, respectively, a voltage difference between nodes VVss and Vss. By modulating the strength of this feedback effect, the regenerative action in the bit-cell 1100 can be adjusted during a write operation. In particular, by weakening the feedback effect of the first inverter INV-1, the regenerative action in the bit-cell 1100 is weakened and helps to improve the WNM (i.e. write-ability). This is explained in more detail below.

Although bit-cell 1100 is shown as being coupled to a pair of complementary bit lines, the various embodiments of the invention are not limited in this regard. Rather in some embodiments of the invention, the second bit-line BLB may be omitted. In this case, both access transistors M1 and M2 can be connected to storage node Q and to bit-line BL. However, they would still be configured to conduct in opposite directions to each other, as described above with respect to FIG. 11.

B. Read Operation

In the various embodiments of the invention, the inward access transistor (M1) is chosen for the read operation in bit-cell 1100 as this configuration allows a higher RNM than the outward access transistor configuration. The read cycle starts with pre-charging of the bit-lines BL and BLB (or just BL in the case of a single bit line) associated with a bit-cell of interest to $V_{DD}$. Thereafter, the write line WLm associated with the bit cell of interest (selected via row decoder 1204) is asserted to '1' to enable the access transistors M1 and M2. Further, the column multiplexer 1208 is configured for reading the bit-line BLn associated with the bit-cell of interest. If the bit stored at node Q is a '0', then the access transistor (M1) starts discharging the bit-line BLn by conducting current in inward direction via transistors M1 and M4. Thus, the voltage on the bit-line BLn is pulled down through the current flow path formed by M1 and M4. The sense amplifier 1214 is then triggered (either by the current flow or by a change of voltage) and generates a signal indicating that a '0' is stored in the selected bit-cell. If the bit stored at node Q is a '1', the bit-line BLn remains pre-charged at $V_{DD}$ unperturbed.

Figure 13B:
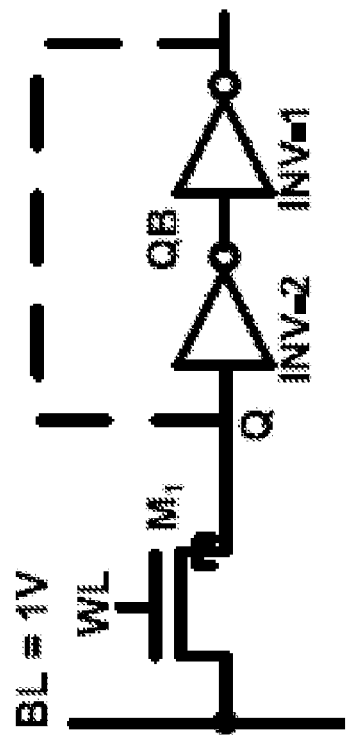
FIGS. 13(a), 13(b) and 13(c) show the read current path, equivalent bit-cell diagram for write '1' and equivalent bit-cell diagram for write '0' respectively for the 6T TFET SRAM bit-cell design of FIG. 11.
Figure 13C:
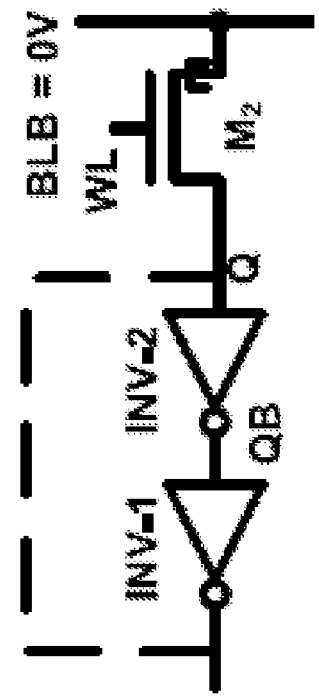
Figure 13A:
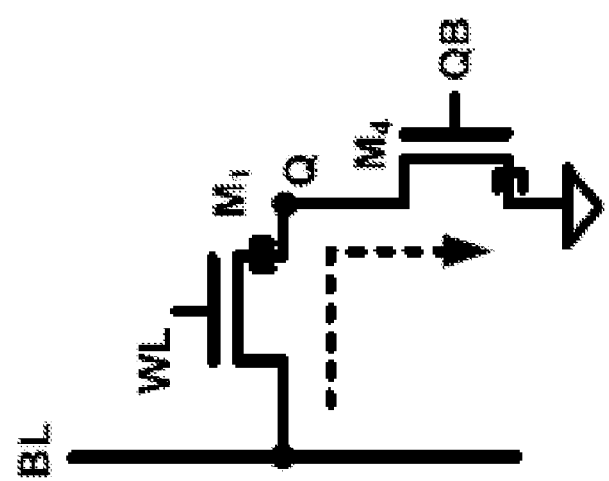

FIG. 13(a) shows the current path during a read operation formed by the access transistor (M1) and pull-down transistor (M4) in the disclosed design of FIG. 11. Therefore, Read Noise Margin (RNM) in this design is governed by the ratio of the drive currents of M4 and M1. Accordingly, for a better RNM M4 is configured to be stronger than the M1. In at least one configuration, this can be provided via selecting a channel width of M4 to be greater than a channel width of M1.

C. Write Operation

As described above, in the various embodiments of the invention, the VVss node of the first inverter INV-1 and the Vss node of the second inverter INV-2 are not coupled together. Rather, they are controlled separately in order to improve the WNM. This is explained below.

The write operation in bit-cell 1100 can be performed through either one of the access transistors (M1, M2) depending on the data to be written to the bit-cell 1100. To write a '1' onto node Q (when it initially contains a '0' and QB accordingly contains a '1'), both the bit-lines (BL and BLB) are charged to $V_{DD}$. Thereafter, the write line WLm associated with the bit cell of interest (selected via row decoder 1204) is asserted to '1' to enable the access transistors M1 and M2. At the same time, the control logic 1210 can sends a short (positive) voltage pulse to the VVss node independently of the voltage of the ground line Vss. The magnitude of the pulse is greater than the voltage at the Vss node, but lower than the supply voltages at the $V_{DD}$ node. This temporarily reduces the gain of the n-channel TFET M4. At this point node QB, which is the input to INV-1, still stores a '1'. Thus, the n-channel TFET M4 remains on but the output of INV-1 at node Q is raised above '0' for the duration of the pulse. This weakens (or even completely disables) the positive feedback provided by the first inverter INV-1 to the second inverter INV-2, as shown by the equivalent circuit in FIG. 13(b) for writing a '1', which allows a '1' to be asserted to node Q. In other words, the short voltage pulse applied to VVss makes it easier to write a '1' to node Q as node Q is no longer provided with direct access to a ground or reference voltage through transistor M4.

Once the charge at Q reaches the trip-point of the second inverter INV-2, QB becomes '0'. The voltage at VVss can then be decreased to the same ground or reference voltage by the control logic 1210 (i.e., the short voltage pulse comes to an end) independently of the ground line Vss. This strengthens the positive feedback provided by the first inverter INV-1 to the second inverter INV-2 in order to maintain the newly written information at nodes Q and QB in the bit-cell.

In general, the voltage at Vss and/or VVss can be adjusted via one or more voltage regulators supplying these values to the array. Thus, during a read operation, the voltage regulator can be configured to provide lower values can be provided In this configuration, the write '1' operation is performed via access transistor M1. Although access transistor M2 is also on during this operation, the voltage at BLB does not affect the voltage at nodes Q or QB since transistor is configured for outward conduction and BLB is at $V_{DD}$. Thus, the pre-charging of bit-line BLB to $V_{DD}$ prevents node Q from being discharged during the write '1' operation.

To write a '0' at node Q, when it is initially at logic '1' (i.e., flipping the bit content), both bit-lines (BL and BLB) are discharged to a ground or reference voltage (Vss). The word-line enable signal, WL='1', is then set by the write control logic. In some configurations, the voltage at node VVss is raised by the write control logic 1210, as previously described to weaken the positive feedback provided by the first inverter INV-1 to the second inverter INV-2, as shown by the equivalent circuit in FIG. 13(c) for writing a '0'. Although, this step is not strictly necessary for the write '0' operation, this can simplify overall operating procedures for the bit-cell 1100. That is, the operation for writing a '1' or a '0' will be substantially the same with the exception of the values on bit-lines BL and BLB. In contrast to the write '1' operation, the write '0' operation is performed via access transistor M2. That is, the charge at node Q is discharged via transistor M2.

Once the charge at Q reaches the trip-point of the second inverter INV-2, QB becomes '1'. If necessary, the voltage at VVss can then be decreased to the same ground or reference voltage by the control logic 1210 (i.e. the short voltage pulse comes to an end) independently of the ground line Vss. This strengthens the positive feedback provided by the first inverter INV-1 to the second inverter INV-2 in order to maintain the newly written information at nodes Q and QB in the bit-cell.

In this configuration, the write '0' operation is performed via access transistor M2. Although access transistor M1 is also on during this operation, the voltage at BL does not affect the voltage at nodes Q or QB since transistor M1 is configured for inward conduction and BL is at Vss. Thus, the pre-charging of bit-line BL to $V_{DD}$ prevents node Q from being charged during the write '0' operation.

In addition to adjusting the voltages at VVss or Vss, adjustment of VDD can be used to improve writeability of the cell. In particular, if VDD is lowered, this reduces the strength of the cross-coupled inverters with respect to the access transistor. Accordingly, in some embodiments of the invention, the memory array can be configured to receive a variable VDD value. For example, the voltage regulator providing VDD can be configured to lower VDD during write operations.

IV. Design Metrics

Stability, performance, power and area are the key bit-cell design metrics widely used in the industry to identify a potential SRAM bit-cell design, particularly in the nanometer regime. For comparison, conventional 6T CMOS SRAM and 7T TFET SRAM bit-cell designs are used.

Figure 14:
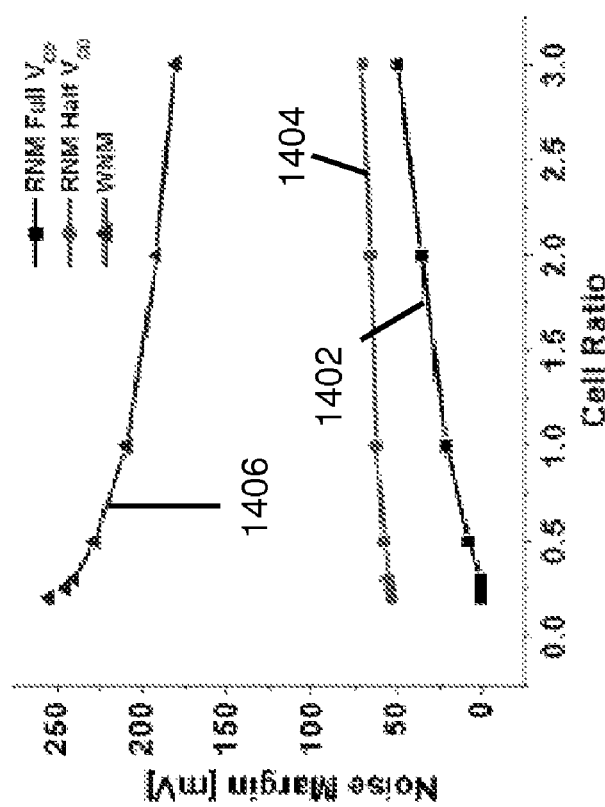
FIG. 14 shows the noise margins for the 6T TFET SRAM of FIG. 11 at $V_{DD}$=0.5V for various cell ratio values.

In order to evaluate successful read and write operations using the bit-cell of FIG. 11, the RNM and WNM of the disclosed 6T TFET SRAM were simulated in HSPICE for different cell ratios, CRs (β) at $V_{DD}$=0.5V, when the pull up ratio is kept at minimum. FIG. 14 shows the noise margins for the 6T TFET SRAM of FIG. 11 at VDD=0.5V for various cell ratio values. In FIG. 14, the RNM at half pre-charged (Curve 1402) and fully pre-charged bit-line (Curve 1404) is measured, it can be seen that the half pre-charged bit-line yields much better RNM than fully pre-charged bit-line. For CR, β>2, there is no significant improvement in the RNM while a slight degradation in the WNM (Curve 1406) is observed. Hence, all the simulation results presented in the figures below use a cell ratio (β) of 2 unless specified.

A. SRAM Bit-Cell Stability

Figure 15:
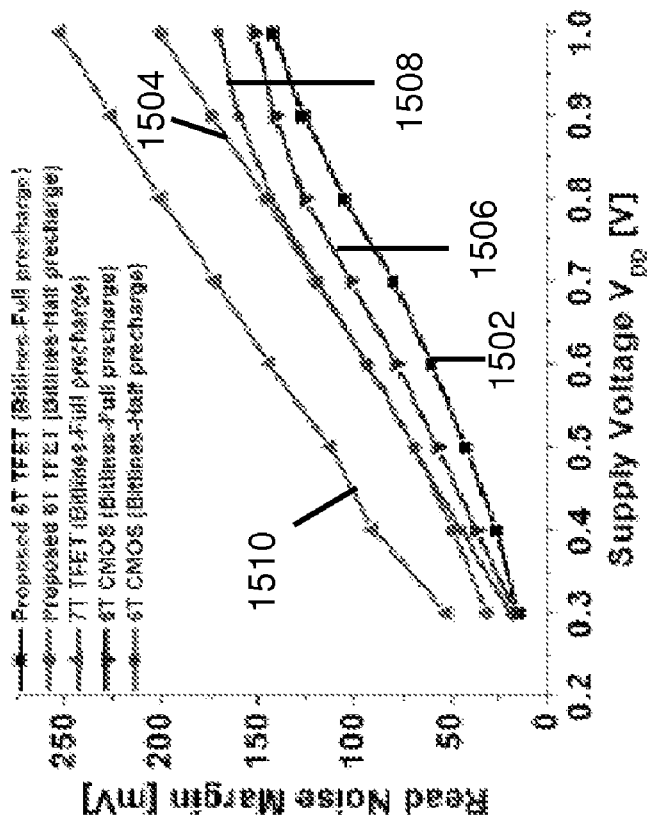
FIG. 15 is a comparison of read Static Noise Margins (SNMs) for different SRAM bit-cell designs at various supply voltages $V_{DD}$.

An adequate read stability and write-ability of a SRAM bit-cell are highly desirable for successful realization of robust and high performance caches. The RNM and WNM are the widely used metrics for stability analysis of a SRAM bit-cell. FIG. 15 shows the RNM of different bit-cell designs. For the disclosed 6T TFET (Curves 1502 and 1504) and 6T CMOS bit-cells (curves 1506 and 1508) both the bit-lines, BL and BLB, are pre-charged to full $V_{DD}$ and half $V_{DD}$ to evaluate the RNM. While, for 7T TFET bit-cell (Curve 1510), pre-charging of bit-lines to any level does not have any impact on the RNM due to its isolated read-port or a separate read word-line. Therefore, 7T TFET SRAM bit-cell shows the highest RNM, because of an isolated read-buffer which yields the RNM equivalent to Hold Static Noise Margin (SNM). The isolated read buffer concept has been widely explored in CMOS SRAM designs to improve the RNMs at the cost of silicon overhead, and referred as read noise margin free SRAM bit-cells. However, the disclosed 6T TFET with fully pre-charged bit-line has the lowest RNM. This is because of the single access transistor which conducts during the read operation and rises the internal node (Q) voltage to a higher value than a 6T CMOS SRAM (while the other access transistor does not assist because of its unidirectionality).

The RNM of the disclosed 6T TFET with half-swing (half pre-charge bit-lines) is much better than the 6T CMOS with half and full pre-charged bit-lines. In 6T CMOS SRAM, half pre-charged bit-lines are not as effective as 6T TFET SRAM. This is due to the symmetric nature of SRAM where one of the bit-lines connected to a node (Q or QB) via access devices storing a $V_{DD}$ is also pre-charged to half $V_{DD}$. Hence, this scenario is not effective in holding that node at $V_{DD}$ as compared to pre-charging to full $V_{DD}$ due to conduction from the node to bit-line in the former case. However, transistor M2 in FIG. 11 does not conduct in the reverse direction and this contributes to higher RNM at half pre-charged $V_{DD}$. At $V_{DD}$=0.3V, we observe a 63% improvement in RNM over a 6T CMOS while it is 59% less than the 7T TFET bit-cell. The advantage of higher RNM in 7T TFET bit-cell is purely from the extra transistor used as a read port.

Figure 16:
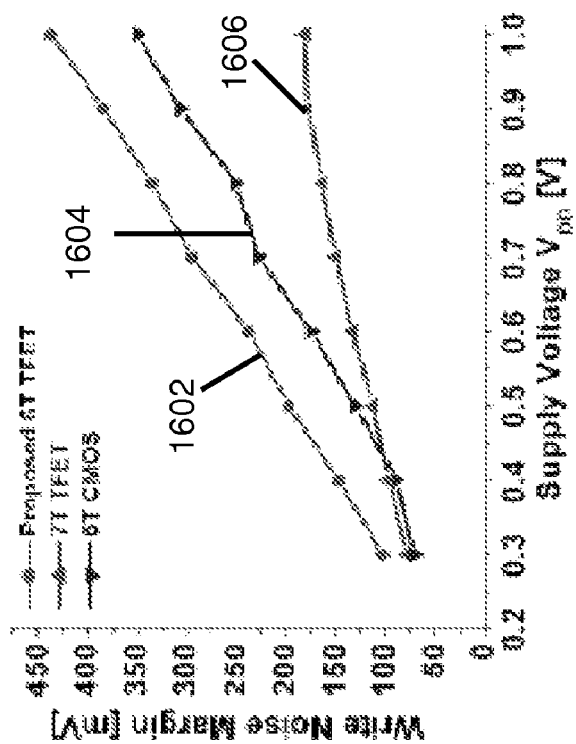
FIG. 16 is a comparison of Write Noise Margins for different SRAM bit-cell designs at various supply voltages $V_{DD}$.

FIG. 16 shows the WNM of the disclosed 6T SRAM bit-cell (Curve 1602), a 6T CMOS bit-cell (Curve 1604), and a 7T TFET bit-cell (Curve 1606) for different $V_{DD}$. The WNM of the disclosed 6T TFET SRAM design is higher than its counterpart designs due to virtual ground mechanism used for weakening of the cross-couple inverters which enables a faster write operation. At $V_{DD}$=0.3V, a 46% and 32% improvement in WNM over 6T CMOS and 7T TFET bit-cells, respectively, is observed.

B. SRAM Bit-Cell Performance

Read and write delays are the metrics used to compare the performance of different SRAM bit-cell designs. In 6T CMOS and 6T TFET bit-cells, read delay is defined as the time delay between 50% of word-line (WL) activation to 10% of pre-charged voltage difference between the bit-lines. In 7T and 8T SRAM bit-cell designs, bit-line sensing is done using CMOS logic gates and not by using differential sense amps. So, for the 7T TFET bit-cell, read delay is measured between 50% of word-line (WL) activation to 50% of pre-charged bit-line voltage.

Figure 17:
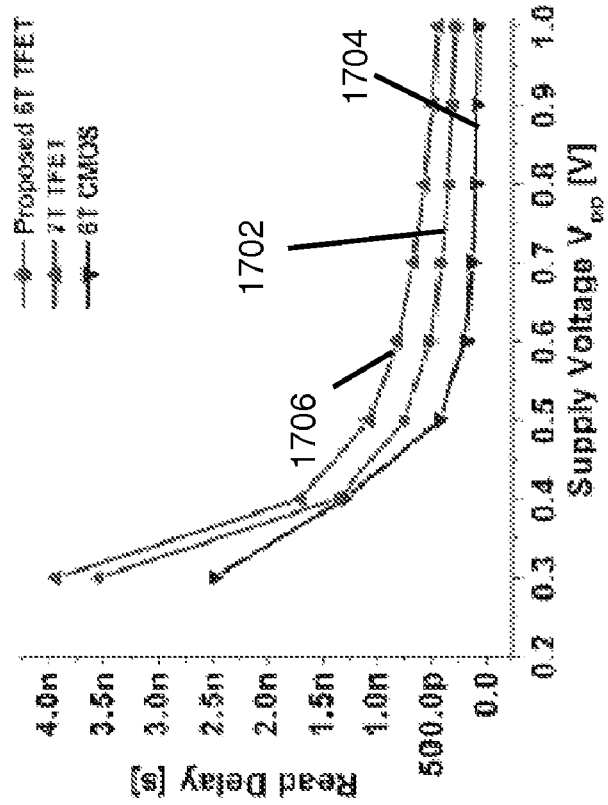
FIG. 17 is a comparison of read delay for different SRAM bit-cell designs at various supply voltages $V_{DD}$.

FIG. 17 shows the read delay of the disclosed 6T SRAM bit-cell (Curve 1702), a 6T CMOS bit-cell (Curve 1704), and a 7T TFET bit-cell (Curve 1706). FIG. 17 shows that CMOS performs better than TFETs in the entire voltage range due to higher drive current observed in CMOS. At $V_{DD}$=0.3V, 6T CMOS design has a better read delay than 6T TFET and 7T TFET by 40% and 58% respectively. However, this problem can be solved in TFETs by moving to lower band-gap and low effective mass materials. For example, Indium Arsenide (InAs) can be used, which has a higher tunneling rate through the barrier and higher drive current (ION) of ~85 µA/µm for $V_{DD}$=0.25V. However, the various embodiments are not limited in this regard and other materials can also be used.

Figure 18:
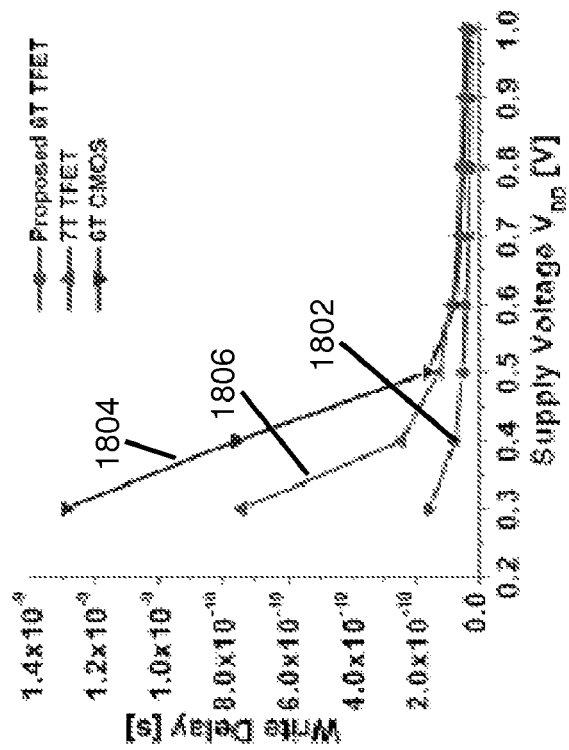
FIG. 18 is a comparison of write delay for different SRAM bit-cell designs at various supply voltages $V_{DD}$.

The write delay is defined as the time between the 50% activation of the word-line (WL) to when the internal Q is flipped to 90% of its full swing. At lower voltages, write delay of the disclosed 6T TFET SRAM design is significantly less than the 6T CMOS and 7T TFET SRAM designs, as shown in FIG. 18. FIG. 18 shows the write delay of the disclosed 6T SRAM bit-cell (Curve 1802), a 6T CMOS bit-cell (Curve 1804), and a 7T TFET bit-cell (Curve 1806). This is due to the simple fact of breaking (or reducing the effectiveness of) the cross coupling which enables a faster write speed than other designs. The write delays for 6T CMOS and 7T TFETs are 8.1× and 4.7× times higher than the disclosed 6T TFET bit-cell design at $V_{DD}$=0.3V.

C. Leakage Power

Figure 19:
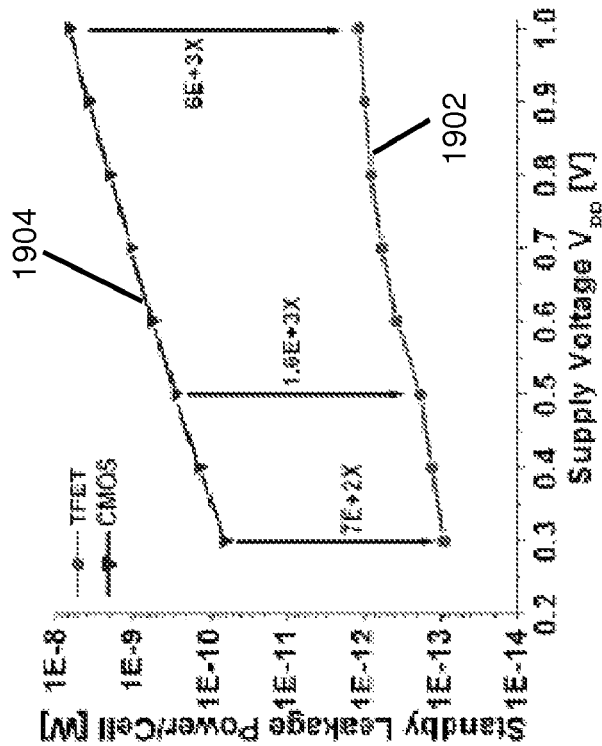
FIG. 19 shows the standby leakage power per cell for different CMOS and TFET SRAM designs.

A significant increase in the leakage current in MOSFETs with decreasing gate length results from the increasing band-to-band tunneling at the drain-channel junction, when the channel doping is high in the sub-100 nm MOSFETs. However, the leakage in TFETs is much smaller because of the larger barrier of the reversed p-i-n junction. The OFF state leakage current of a TFET is 100s of order of magnitude lower than the CMOS. Thus, a significant improvement in terms of leakage reduction is provided, as shown in FIG. 19. FIG. 19 shows the standby leakage per bit-cell of the TFET-based bit-cell (Curve 1902) and a 6T CMOS bit-cell (Curve 1904). Both 6T and 7T TFET bit-cells have equal leakage power due to the presence of the same leakage paths. Assuming that the node connected to the read-port id held at '0', a 700× and 1600× improvement in leakage reduction over 6T CMOS bit-cell at 0.3V and 0.5V $V_{DD}$, is achieved. This shows that TFETs are a potential replacement candidate for CMOS transistors at low voltage and low power applications.

D. Area

Figure 20A:
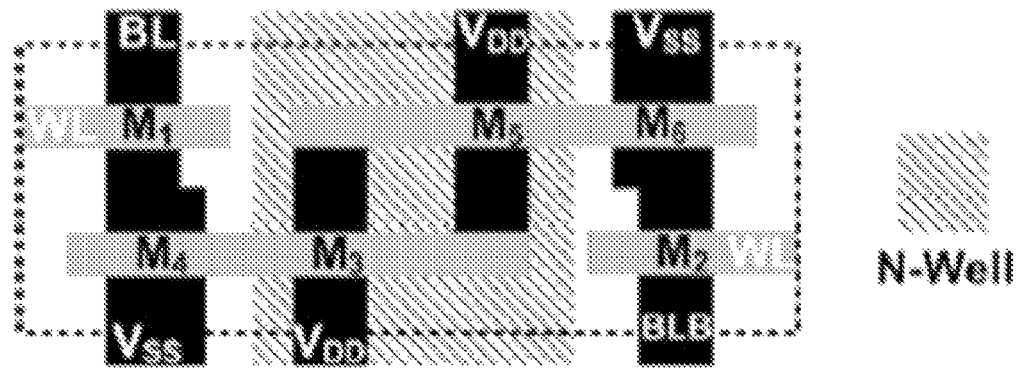
FIGS. 20(a), 20(b), and 20(c) show efficient SRAM bit-cell layouts for the conventional 6T CMOS bit-cell, the 6T TFET bit-cell of FIG. 11, and a conventional 7T TFET bit-cell, respectively.
Figure 20B:
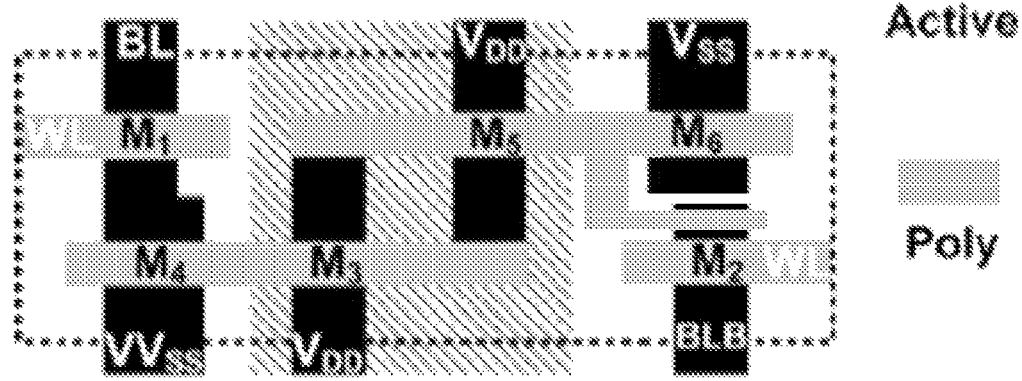
Figure 20C:
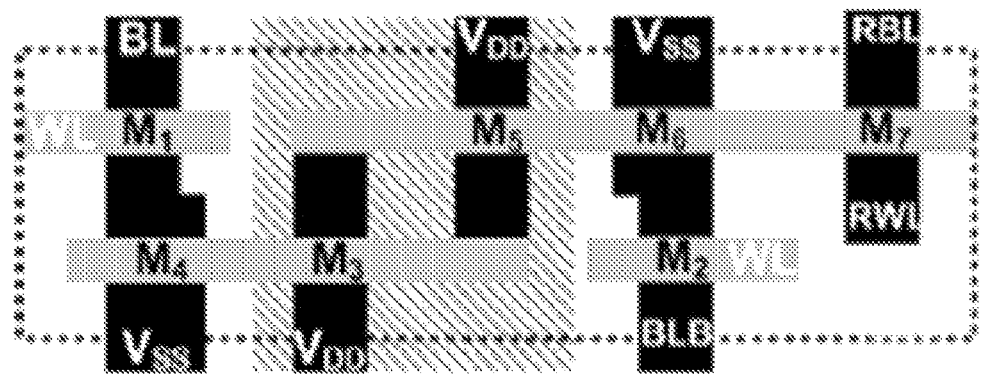

A comparison of the layout for the conventional 6T CMOS, the disclosed 6T TFET and 7T TFET bit-cells is shown in FIGS. 20(a)-(c). FIG. 20(a) is an exemplary layout for the 6T CMOS bit-cell. FIG. 20(b) is an exemplary layout for the disclosed 6T SRAM bit-cell. FIG. 20(c) is an exemplary layout for the 7T TFET bit-cell. The layouts adhere to the "thin bit-cell" topology (see Khare, M. et al (2002): "A high performance 90 nm SOI technology with 0.992 m2 6T SRAM cell", Electron Devices Meeting, 2002. IEDM '02. Digest. International, 407-410), alleviating lithography stresses and device mismatch sources by minimizing jogs in the poly. As shown, these layouts are highly efficient in the sense that they amenably allow sharing of all source and drain junctions and poly wires with abutting cells. However, these baseline layouts can change dramatically to optimize for low-voltage operation and high data stability in the presence of process variation.

The 7T TFET SRAM bit-cell will generally result in an increase of around 15% area overhead over the conventional 6T SRAM bit-cell, as shown by FIGS. 20(a) and 20(c). However, the disclosed 6T TFET SRAM bit-cell can be realized without increase in silicon overhead, as compared to the conventional 6T CMOS bit-cell, as shown by FIGS. 20(a) and 20(b).

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A memory device, comprising:
   first and second cross-coupled inverters, the first inverter having a first ground node and the second inverter having a second ground node different than the first ground node;
   first and second access transistors coupled to an input node of the second inverter; and
   at least one control circuit configured for providing a first reference voltage at the first ground node of the first inverter and a second reference voltage at the second ground node of the second inverter and selectively adjusting a difference between the first reference voltage and the second reference voltage,
   wherein the first access transistor is configured to conduct current from a first bit line to the input node and to be substantially incapable of conducting current from the input node to the first bit line, and wherein the second access transistor is configured to conduct current from the input node to one of the first bit line and a second bit line and to be substantially incapable of conducting current from the one of the first and the second bit lines to the input node.

2. The device of claim 1 wherein at least one of the first and second access transistors comprises a quantum field effect transistor.

3. The device of claim 1 wherein at least one of the first and second access transistors comprises a tunnel field effect transistor.

4. The device of claim 1, wherein the first inverter comprises a first pull down transistor configured to conduct current from the input node to the first ground node and to be substantially incapable of conducting current from the first ground node to the input node, and wherein the second inverter comprises a second pull down transistor configured to conduct current from an output node of the second inverter to the second ground node and to be substantially incapable of conducting current from the second ground node to the output node.

5. The device of claim 1, wherein the first inverter comprises a first pull up transistor is configured to conduct current from a supply node for the first and second inverters to the input node and to be substantially incapable of conducting current from the input node to the supply node, and wherein the second inverter comprises a second pull up transistor configured to conduct current from the supply node to the output node and to be substantially incapable of conducting current from the output node to the supply node.

6. The device of claim 5, wherein a cell ratio in the cross-coupled inverters is at least 2.

7. The device of claim 1, wherein the control circuit is configured for increasing the difference during a write operation and decreasing the difference during a read operation.

8. The device of claim 7, wherein the control circuit is configured for increasing the difference during the write operation by causing the first reference voltage to be higher than the second reference voltage.

9. The device of claim 7, wherein the control circuit is configured for decreasing the difference during the read operation by causing the first reference voltage to be substantially equal to the second reference voltage.

10. A method of writing a bit value into a latch cell having first and second cross-coupled inverters and first and second access transistors coupled to the input node of the second inverter, where the first access transistor is configured to conduct current from a first bit line to the input node and to be substantially incapable of conducting current from the input node to the first bit line, and where the second access transistor is configured to conduct current from the input node to a second bit line and to be substantially incapable of conducting current from the second bit line to the input node, the method comprising:
   increasing a difference between a first reference voltage at a first ground node of the first inverter and a second reference voltage at a second ground node of the second inverter;
   setting at least one of the first and second bit lines to a desired bit value;
   enabling at least one of the first and second access transistors based on the desired bit value; and responsive to said enabling, reducing a difference between the first reference voltage and the second reference voltage and disabling the enabled ones of the first and second access transistors.

11. The method of claim 10, wherein the step of increasing further comprises selecting the first reference voltage to be higher than the second reference voltage.

12. The method of claim 10, wherein the step of opening further comprises:
enabling at least the first access transistor if the desired bit value is a high bit value, else enabling at least the second access transistor.

13. The method of claim 10, wherein the step of reducing further comprises selecting the first reference voltage to be substantially equal to the second reference voltage.

14. The method of claim 10, further comprising:
reducing a supply voltage for the latch cell while the at least one of the first and second access transistors is enabled.

15. A memory device, comprising:
first and second cross-coupled inverters;
first and second access transistors coupled to an input node of the second inverter; and
at least one control circuit configured for providing a first voltage between a first reference node and a first ground node of the first inverter and a second voltage between reference and ground nodes of the second inverter and selectively adjusting a difference between the first voltage and the second voltage, and
wherein the first access transistor is configured to conduct current from a first bit line to the input node and to be substantially incapable of conducting current from the input node to the first bit line, and wherein the second access transistor is configured to conduct current from the input node to one of the first bit line and a second bit line and to be substantially incapable of conducting current from the one of the first and the second bit lines to the input node.

16. The device of claim 15, wherein the control circuit is configured for increasing the difference during a write operation and decreasing the difference during a read operation.

17. The device of claim 16, wherein the control circuit is configured for increasing the difference during the write operation by causing the first voltage to be higher than the second voltage and for decreasing the difference during the read operation by causing the first reference voltage to be substantially equal to the second reference voltage.

18. The device of claim 15 wherein at least one of the first and second access transistors comprises one of a quantum field effect transistor a tunnel field effect transistor.

19. The device of claim 15, wherein the first inverter comprises a first pull down transistor configured to conduct current from the input node to the first ground node and to be substantially incapable of conducting current from the first ground node to the input node, and wherein the second inverter comprises a second pull down transistor configured to conduct current from an output node of the second inverter to the second ground node and to be substantially incapable of conducting current from the second ground node to the output node.

20. The device of claim 15, wherein the first inverter comprises a first pull up transistor is configured to conduct current from a supply node for the first and second inverters to the input node and to be substantially incapable of conducting current from the input node to the supply node, and wherein the second inverter comprises a second pull up transistor configured to conduct current from the supply node to the output node and to be substantially incapable of conducting current from the output node to the supply node.

* * * * *